US008248138B2

(12) United States Patent
Liu

(10) Patent No.: US 8,248,138 B2
(45) Date of Patent: Aug. 21, 2012

(54) METHOD AND APPARATUS FOR PREVENTING PHASE INTERPOLATION CIRCUIT FROM GLITCH DURING CLOCK SWITCHING

(75) Inventor: Ye Liu, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 133 days.

(21) Appl. No.: 12/720,376

(22) Filed: Mar. 9, 2010

(65) Prior Publication Data

US 2010/0231283 A1  Sep. 16, 2010

(30) Foreign Application Priority Data

Mar. 10, 2009  (TW) ............................. 98107618 A
Dec. 17, 2009  (TW) ............................. 98143292 A

(51) Int. Cl.
*G06F 1/04* (2006.01)
*H03K 3/00* (2006.01)

(52) U.S. Cl. ......... 327/291; 327/149; 327/298; 327/355
(58) Field of Classification Search .................. 327/149, 327/291

See application file for complete search history.

(56) References Cited

U.S. PATENT DOCUMENTS

2007/0147564 A1*  6/2007  Fan et al. .................... 375/355
2009/0102523 A1*  4/2009  Kim et al. ................... 327/149

* cited by examiner

*Primary Examiner* — John Poos
(74) *Attorney, Agent, or Firm* — Morris Manning & Martin LLP; Tim Tingkang Xia, Esq.

(57) ABSTRACT

The present invention relates to a method and an apparatus, during a phase switching process, for choosing all of outputted phases upon the clock phases devoid of phase switching so as to avoid glitches during clock switching. Compared with the conventional approach for removing glitches by controlling a clock switching sequence, an improvement of a phase rotator is further disclosed in the present invention, which eliminates the glitches of the outputted phase clock so as to realize a glitch-less phase switching in a phase interpolation circuit.

14 Claims, 15 Drawing Sheets

METHOD AND APPARATUS FOR PREVENTING PHASE INTERPOLATION CIRCUIT FROM GLITCH DURING CLOCK SWITCHING

BACKGROUND OF THE INVENTION

1. Field of the Invention

The present invention relates to a method and an apparatus for preventing a glitch, more particularly to, a method and an apparatus for preventing a glitch caused by a clock switching in a phase-interpolating circuit.

2. Description of the Prior Arts

A phase-interpolating circuit, which acts as a phase generating circuit, has a function for mixing two designated input clocks according to a desirable ratio, so as to generate a clock having a phase located between the two inputted clocks. Since the phase interpolating circuit is capable of generating a clock with designated phase, hence, the aforesaid circuit, is widely applicable such as clock multiplying unit circuit, clock generating circuit and clock/data recovery.

FIG. 1 illustrates a popular phase-interpolating circuit 10, where VO1P, VO1N, and VO0P, VO0N are deemed respectively as a pair of differential clock signal inputs with contiguous phases. The skilled artisan can varies a ratio between the variable current sources 101 and 102, namely α, so as to determined the designated ratio in an outputted clock for these two input clocks. In real application, the phase-interpolating circuit 10 usually co-operates with a phase rotator circuit, where the phase rotator generates desirable information for an output clock phase, and the circuit 10 bases upon the outputs of the phase rotator circuit to generate a desirable clock phase.

As FIG. 2 illustrates, the phase rotator bases upon the desirable output clock phase and chooses two contiguous clocks, which act as the inputs for the circuit 10, and meanwhile, determines the α value. A interpolation is applied to the two input clocks according to the α value so as to acquire a desirable output phase.

The design criterion for the phase rotator/phase-interpolating system, is to ensure the output phase is devoid of glitch while output clocks switch their phases. As FIG. 3 illustrates, while the designated output phase jumps from a contiguous clock set such as clock 1 and clock 2 to another contiguous clock set such as clock 2 and clock 3, inevitably, there exists a demand for a switching for the input clocks of the phase-interpolating circuit. Correspondingly, the input clock for the phase-interpolating circuit needs to switch from a weighted phase between clock 1 and clock 2 to another weighted phase between clock 2 and clock 3, namely, the VO1P, VO1N of circuit 10 have an input clock switching from clock 1 to clock 3. And during the clock switching, however, if the switching timing is improper, exemplarily, while enable 1 or enable 3 located at a rising or falling edge, if the clock 1 or clock 3 are of logic high, then there will be a glitch at the VO1P or VO1N side so as to introduce a glitch at the output side of the circuit 10. For preventing the foregoing drawback, the conventional approach is, during the clock switching, to ensure the clock 1 and clock 3 both locate at logic low, consequently, at the time of input clock switching, phase is devoid of glitch at switching spot so as to prevent the glitch. However, for ensuring the logic low, inevitably, an extraordinary sequential control circuit is needed, and the corresponding and possible delay situations must be considered, so as to increase the circuit design complexities and difficulties. For addressing the foregoing issues, the present invention discloses a new glitch prevention mechanism, for effectively prevent the foregoing complicated sequential control circuit, and reduce the circuit design difficulties and correspondingly saving area and power consuming.

Accordingly, in view of the above drawbacks, it is an imperative that a method and an apparatus for preventing glitches so as to greatly improve the influence of clock switching vs. output phase.

SUMMARY OF THE INVENTION

In view of the disadvantages of prior art, the primary object of the present invention is to prevent glitches caused by clock switching in a phase-interpolating circuit.

According to one aspect of the present invention, one skilled in the art can provide a method for preventing glitches caused by clock switching in a phase-interpolating circuit, comprising:

providing a reference signal;

generating a plurality of phase signals corresponding to the reference signal;

selecting sequentially three contiguous signals such as a first phase signal, a second phase signal, and a third phase signal from the phase signals corresponding to the reference signal;

inputting the first phase signal and the second phase signal to two input terminals of the phase-interpolating circuit and generating a first phase interpolating signal according to a first ratio;

judging whether or not the first phase signal or the third phase signal is of logic high; if it is, simultaneously inputting the second phase signal to the two input terminals of the phase-interpolating circuit so as to generate a transient phase-interpolating signal; if it is not, go to next step; and inputting the second phase signal and the third phase signal to the two input terminals of the phase-interpolating circuit and generating a second phase interpolating signal according to a second ratio.

Preferably, the first ratio and the second ratio are determined by ratio between bias currents of the phase-interpolating circuit.

Preferably, the plurality of phase signals corresponding to the reference signal is even phase signals in regard the reference signal.

The present invention further relates to a method for preventing glitches caused by clock switching in a phase-interpolating circuit, comprising:

providing a reference signal;

generating a plurality of phase signals corresponding to the reference signal;

selecting sequentially three contiguous signals such as a first phase signal, a second phase signal, and a third phase signal from the phase signals corresponding to the reference signal;

inputting the first phase signal and the second phase signal to two input terminals of the phase-interpolating circuit and generating a first phase interpolating signal according to a first ratio;

judging whether or not the first phase signal or the third phase signal is of logic high; if it is, selecting the first ratio to be a specific value for enacting the first phase signal is of no use for the phase-interpolating circuit; if it is not, go to next step; and inputting the second phase signal and the third phase signal to the two input terminals of the phase-interpolating circuit and generating a second phase interpolating signal according to a second ratio.

Preferably, the first ratio and the second ratio are determined by ratio between bias currents of the phase-interpolating circuit.

Preferably, the plurality of phase signals corresponding to the reference signal is even phase signals in regard the reference signal.

The present invention further relates to a state machine, for preventing glitches occurred in a phase rotator and cooperating with the phase rotator to generate a digital clock signal based upon a reference clock, comprising: a first state, for generating a first clock signal based upon a first weighted value of a first phase and a second phase; a second state, for generating a second clock signal based upon a second weighted value of the second phase and a third phase; an intermediate state, for generating an intermediate clock signal based upon the second phase; a first transient state, for switching from the first state to the second state under a control signal; and a second transient state, for switching from the first state to the second state via the intermediate state under the control signal; wherein, the first phase, the second phase, and the third phase are even-spaced phase in regard of the reference clock and the digital clock signal is selected from a group consisting of the first state, the second state, and the intermediate state.

The present invention further relates to a phase rotator, for receiving a reference clock so as to generate a digital clock signal, comprising: a delay-locked loop, for outputting a plurality of even-spaced phases according to the reference clock; a multiplexer, coupled to the delay-locked loop, for selecting contiguous first phase and second phase selected from the even-spaced phases as its output according to a selecting signal; a phase-interpolating circuit, coupled to the multiplexer, for outputting the digital clock signal by interpolating the two contiguous first phase and second phase based upon a phase interpolating weighted value; and a state machine, coupled to the multiplexer and the phase interpolating circuit, for receiving a control signal and the two contiguous first and second phase so as to control the multiplexer.

The present invention further relates to a phase rotator, for receiving a reference clock so as to generate a digital clock signal, comprising: a delay-locked loop, for outputting a plurality of even-spaced phases according to the reference clock; a multiplexer, coupled to the delay-locked loop, for selecting contiguous first phase and second phase selected from the even-spaced phases as its output according to a selecting signal; a phase-interpolating circuit, coupled to the multiplexer, for outputting the digital clock signal by interpolating the two contiguous first phase and second phase based upon a phase interpolating weighted value; and a state machine, coupled to the multiplexer and the phase interpolating circuit, for receiving a control signal and the two contiguous first and second phase and a state machine weighted value so as to control the multiplexer.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become readily understood from the detailed description given herein below and the accompanying drawings which are given by way of illustration only, and thus are not limitative of the present invention and wherein.

DESCRIPTION OF THE EXEMPLARY EMBODIMENTS

The following descriptions are of exemplary embodiments only, and are not intended to limit the scope, applicability, or configuration of the invention in any way. Rather, the following description provides a convenient illustration for implementing exemplary embodiments of the invention. Various changes to the described embodiments may be made in the function and arrangement of the elements described. For your esteemed members of reviewing committee to further understand and recognize the fulfilled functions and structural characteristics of the invention, several exemplary embodiments cooperating with detailed description are presented as the follows.

Figure 1:
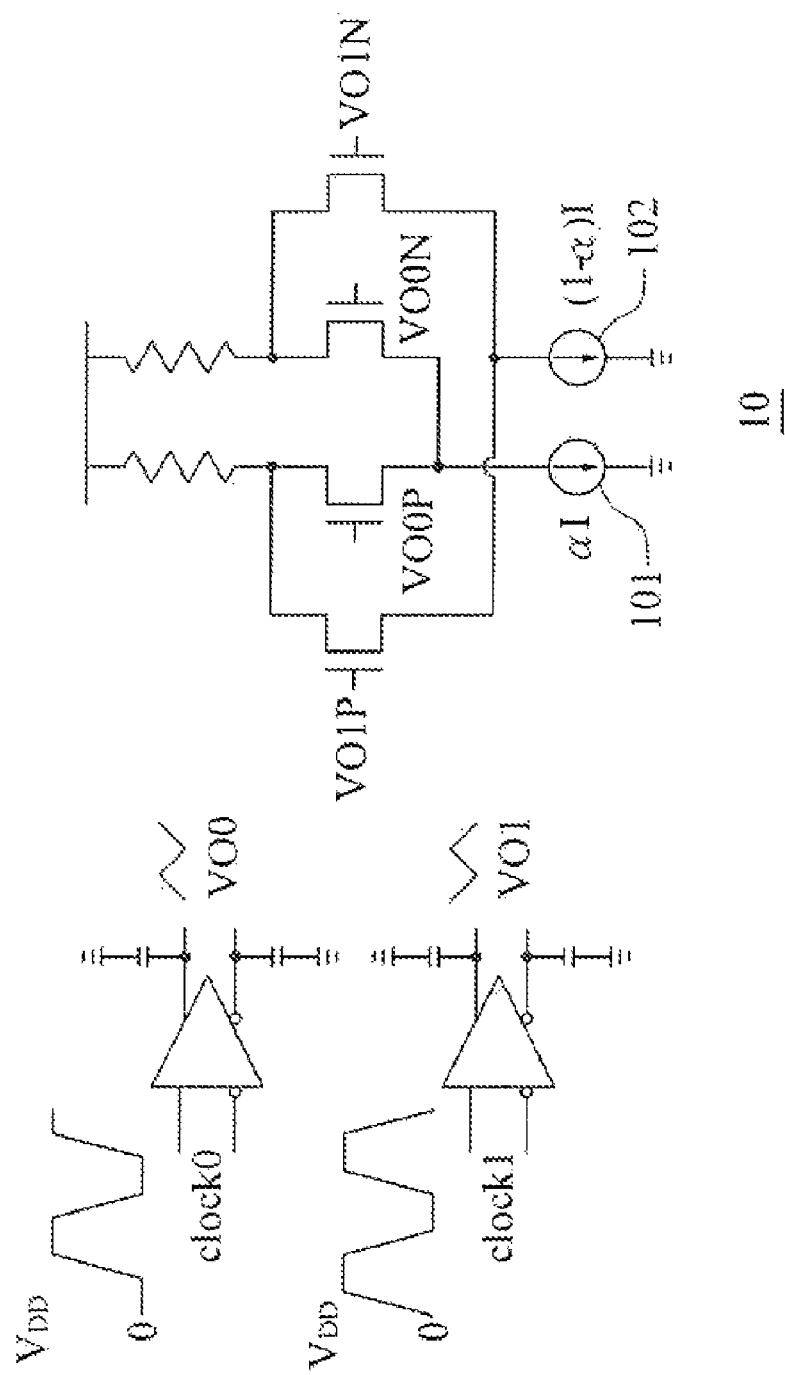
FIG. 1 relates to a phase interpolating circuit illustration according to the prior art.
Figure 2:
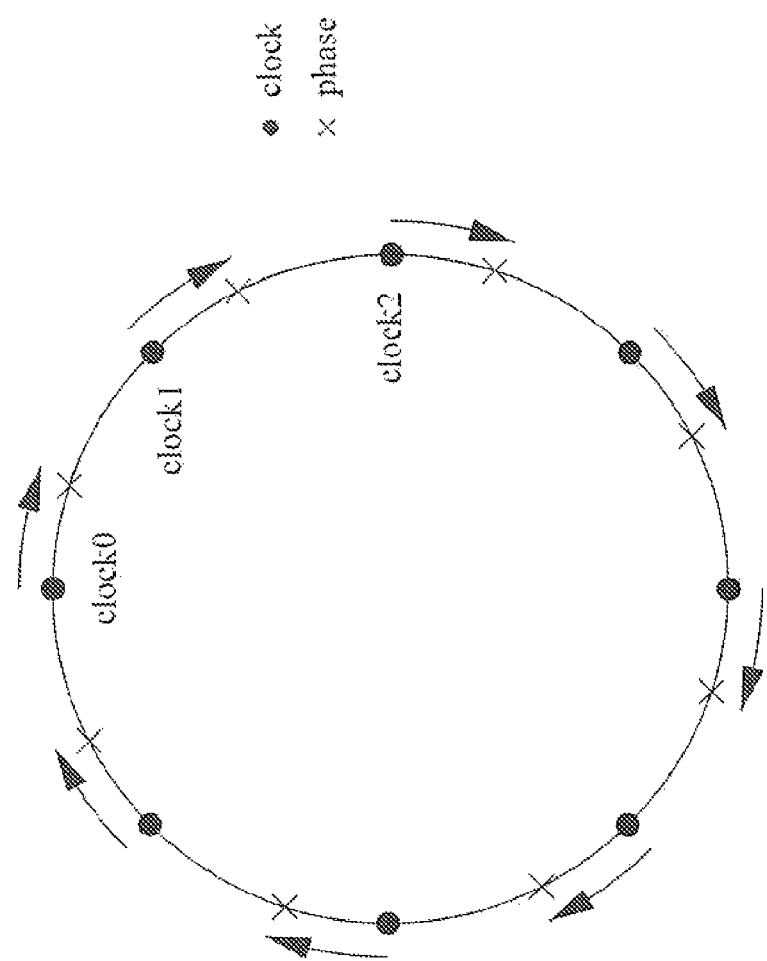
FIG. 2 relates to an illustration for clock phase of the phase interpolating circuit according to the prior art.
Figure 3:
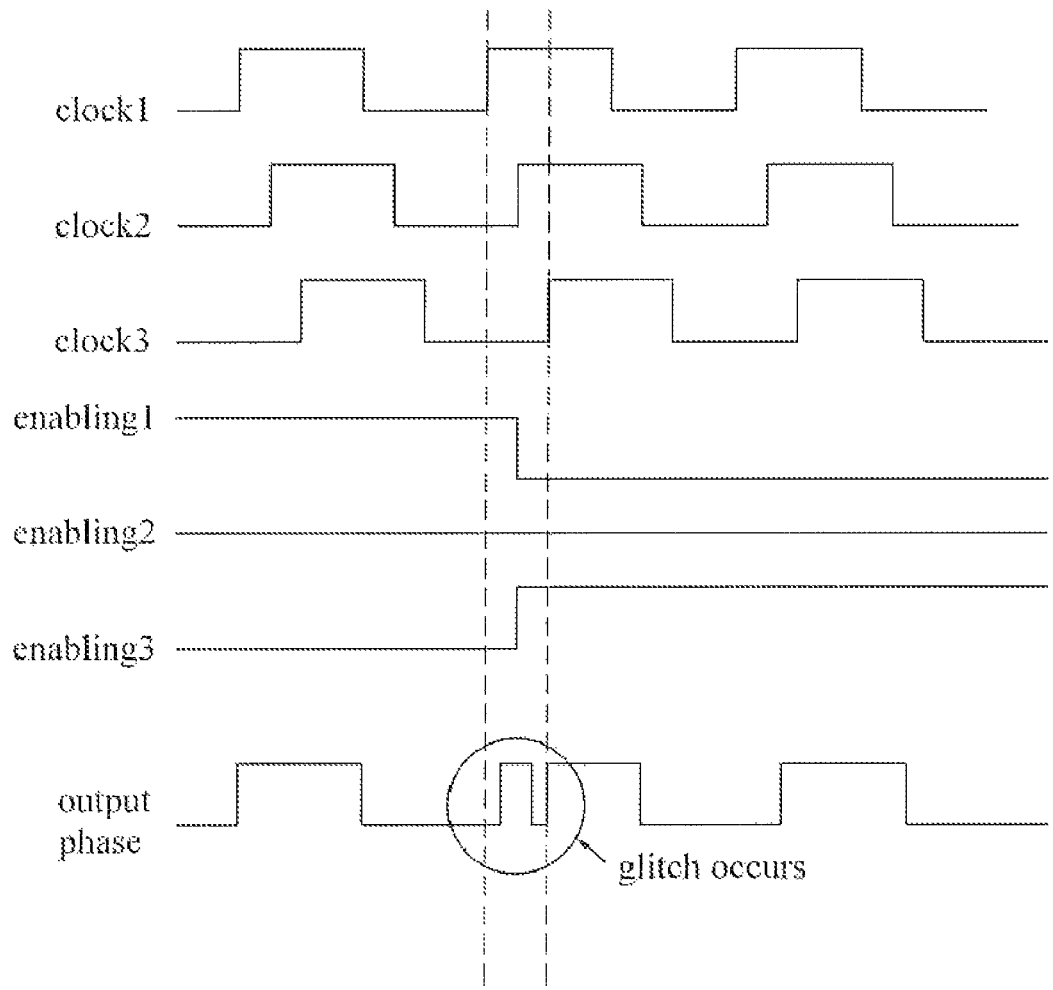
FIG. 3 relates to a waveform of an enabling signal vs. output clock phases according to the prior art.
Figure 4A:
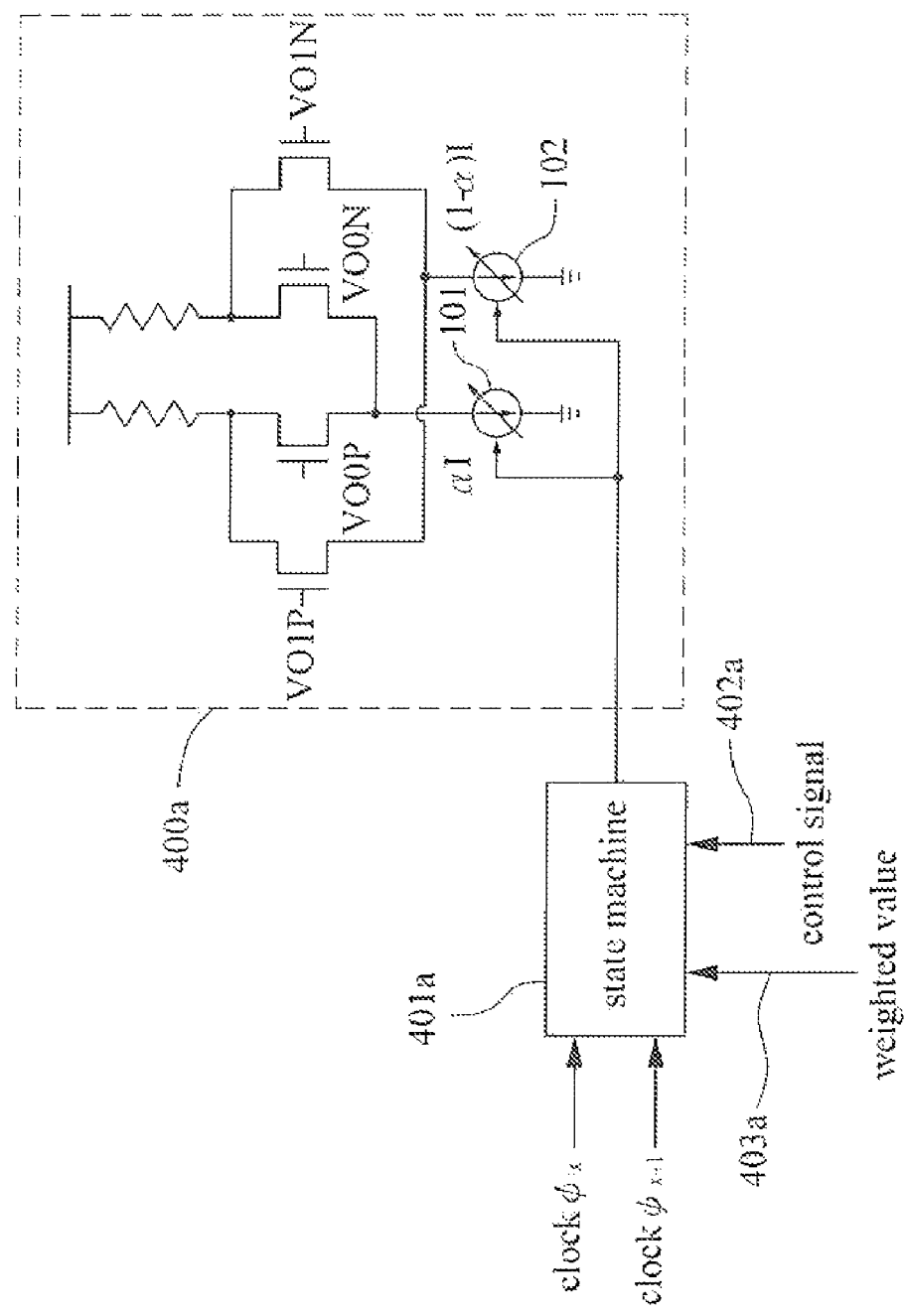
FIG. 4A relates to an illustration of the preferred embodiment in the present invention.

One of the embodiments of the present invention is illustrated in FIG. 4A, and square wave to triangle wave converting circuit is omitted for simplicity. While a phase interpolating circuit 400a has an output phase jumping from clock 1/clock 2 to clock 2/clock 3, input terminals VO0P, VO0N of the phase interpolating circuit 400a stay at clock 2, and meanwhile input terminals VO1P, VO1N of the phase interpolating circuit 400a switch from clock 1 to clock 3. Since the phase switching occurs at logic high of the clock 1, there is a glitch showing at VO1P, VO1N during the switching procedure.

As the aforementioned, the conventional glitchless algorithm is using a designated sequential control circuit to ensure the clock phase switching occurs at the logic low for the clock so as to prevent the foregoing glitches. However, the algorithm disclosed in the present invention is totally irrelevant to the sequential control for the phase switching. Rather, during the phase switching procedure, the output phase is totally relied on the clock phase without phase switching happening, so as to prevent the glitches brought from clock switching for the output clock.

As illustrated in FIG. 4A, during the phase switching procedure of VO1P, VO1N as the input clocks, a state machine 401a is inputted by an input clock $\psi_x$ and $\phi x+1$ (the clock 1 and the clock 2), and the state machine 401a further accepts a control signal 402a and a weighted value 403a. While a control signal 402a is enabling and $\phi x$ phase jumps from clock 1 to clock 3 accompanied with a glitch, regardless the weighted value 403a, the state machine 401a set the $\alpha$ to be 1. Consequently, all bias currents for the phase interpolating circuit 4001 flows through branches of VO0P, VO0N, and VO1P, VO1N branches are totally devoid of any current, therefore, the clock glitch showing at VO1P, VO1N sides will not transmit to output terminals of the phase-interpolating circuit 400a so as to prevent output clock glitches due to the input clock switching. As soon as the clocks showing at the VO1P, VO1N appear stable, or the input clocks $\phi x$ and $\phi x+1$ are both staying at logic low, then the $\alpha$ value is switches to a desirable value such as the weighted value 403a. Hence, the present embodiment differs from the conventional phase switching, at this time the output phase interpolating requires two steps, rather than one-time direct switching to a desired phase.

Figure 4B:
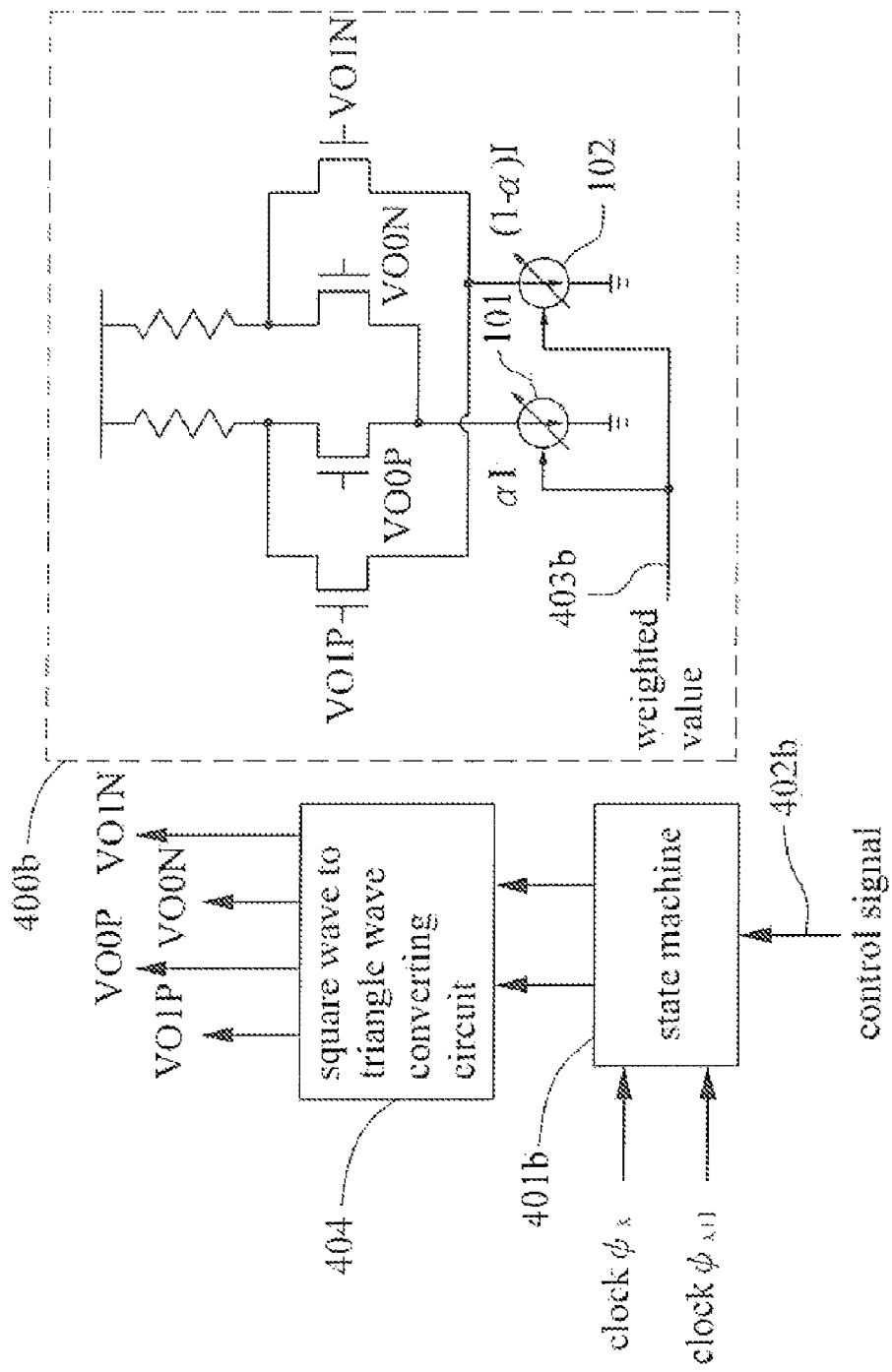
FIG. 4B relates to an illustration of the referred embodiment in the present invention.

As illustrated in FIG. 4B, which differs from FIG. 4A at, during the input clock phase switching for VO1P, VO1N, another state machine 401B accepts a control signal 402b, and regardless how a weighted value 403b changes, when the control signal 402b is enabling and $\phi x$ phase jumps from clock 1 to clock 3 and there is a glitch, regardless the weighted value 403b, the state machine 401b ensures input signals for the square wave to triangle wave converting circuit 404's two input terminals are both the clock 2, namely, at this time the original clock glitch disappears. As soon as the clocks showing at the VO1P, VO1N appear stable, or the input clocks $\phi x$ and $\phi x+1$ are both staying at logic low, then a desired input value such as clock 3 is accepted by one input terminal of the square wave to triangle wave converting circuit 404.

Figure 5:
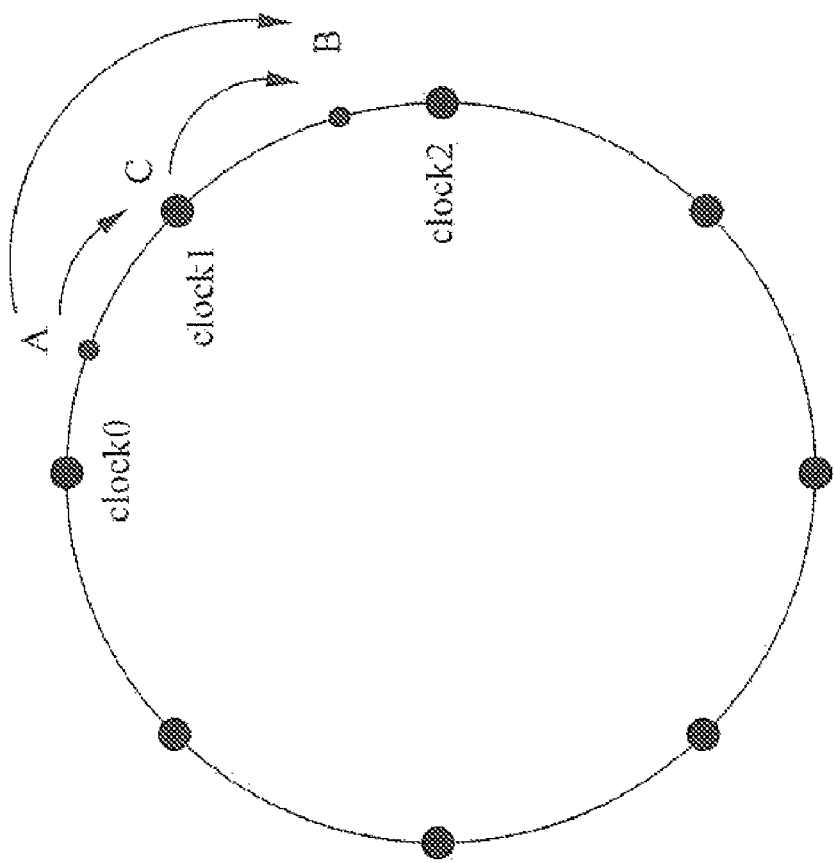
FIG. 5 relates to an illustration of the clock phases according to one of the preferred embodiments of the present invention.

As illustrated in FIG. 5, suppose output clock phase needs to switches from a point A which is between clock 0 and clock 1 to a point B which is between clock 1 and clock 2, according to the disclosure of the present invention, the switching procedure for output phase is not done by one-step jumping directly from the point A to the point B, rather, from the point A to the point B via a point C. And the point C corresponds to the status of a branch devoid of any clock glitches as all current flows through (clock 1 branch) and another branch with a clock glitch as no current flows through (clock 0 to clock 2). Under the state of point C, the glitch caused by the switching procedure from clock 0 to clock 2 will not appear at the output of the circuit, and ultimately while jumping to the state of point B, since the clock switching is completed, the circuit output is devoid of any glitch either.

Figure 6:
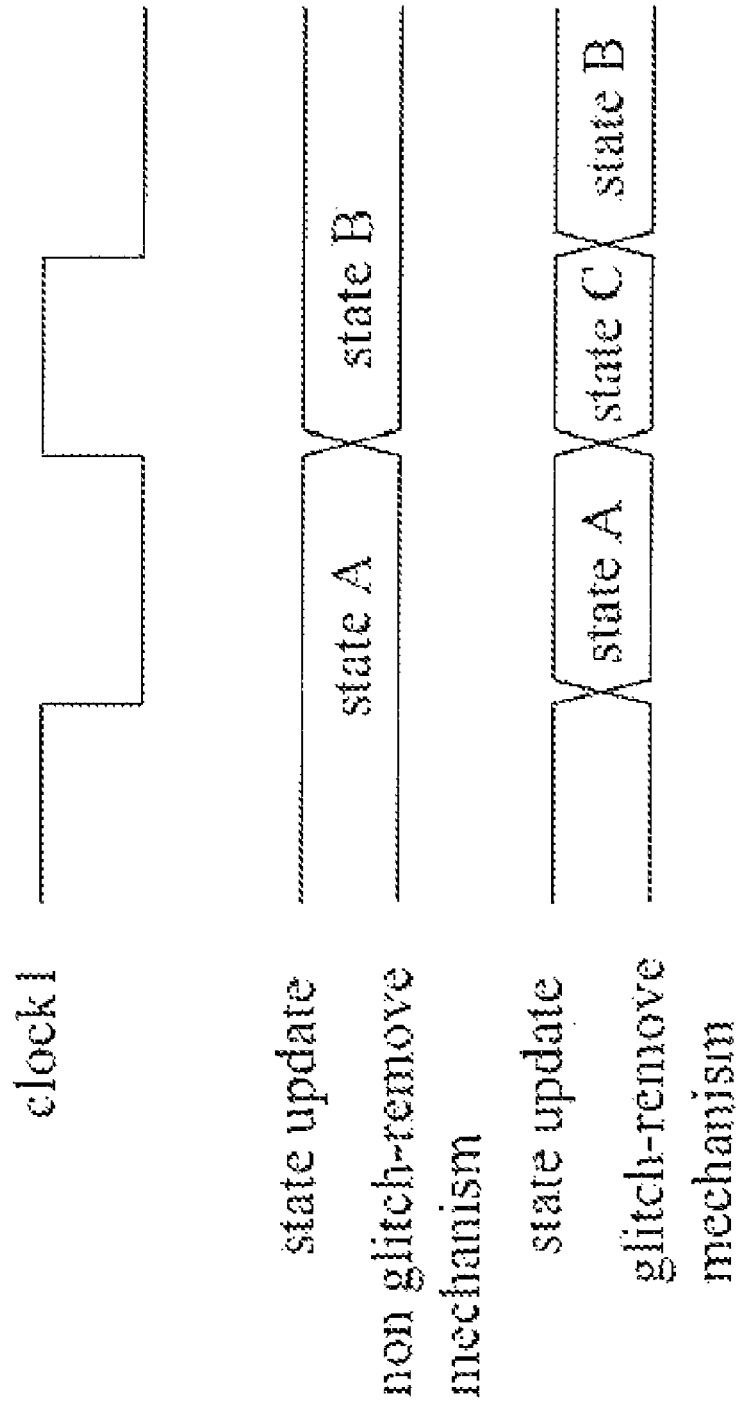
FIG. 6 relates to an updating illustration of clock phases according to the present invention.

For realizing the aforementioned non-glitch switching procedure, an extraordinary glitch-remove jumping is needed (namely the state C) when the phase rotator undergoes output clock phase switching so as to realize the non-glitch switching for the output clock phase as illustrated in FIG. 6, without the non-glitch algorithm, the phase rotator merely updates its new state at the rising edge of clock 1 in FIG. 5; after the glitch-remove algorithm is incorporated, the phase rotator needs to update a new state both at the rising edge and falling edge of the clock 1 (at the rising edge it is switched to be a non-glitch state, and at the falling edge it is switched to be a normal state). Since the phase rotator circuit is usually operated at an operating frequency, which is lower than that of the phase-interpolating circuit, it is easier and more reliable to insert a buffering glitch-remove state in a phase rotator than undergoing a sequential control at the high-frequency input side of the phase-interpolating circuit. Consequently, it is easier and more reliable for the approach disclosed in the present invention than conventional glitch removing method by controlling clock switching sequence.

Figure 7:
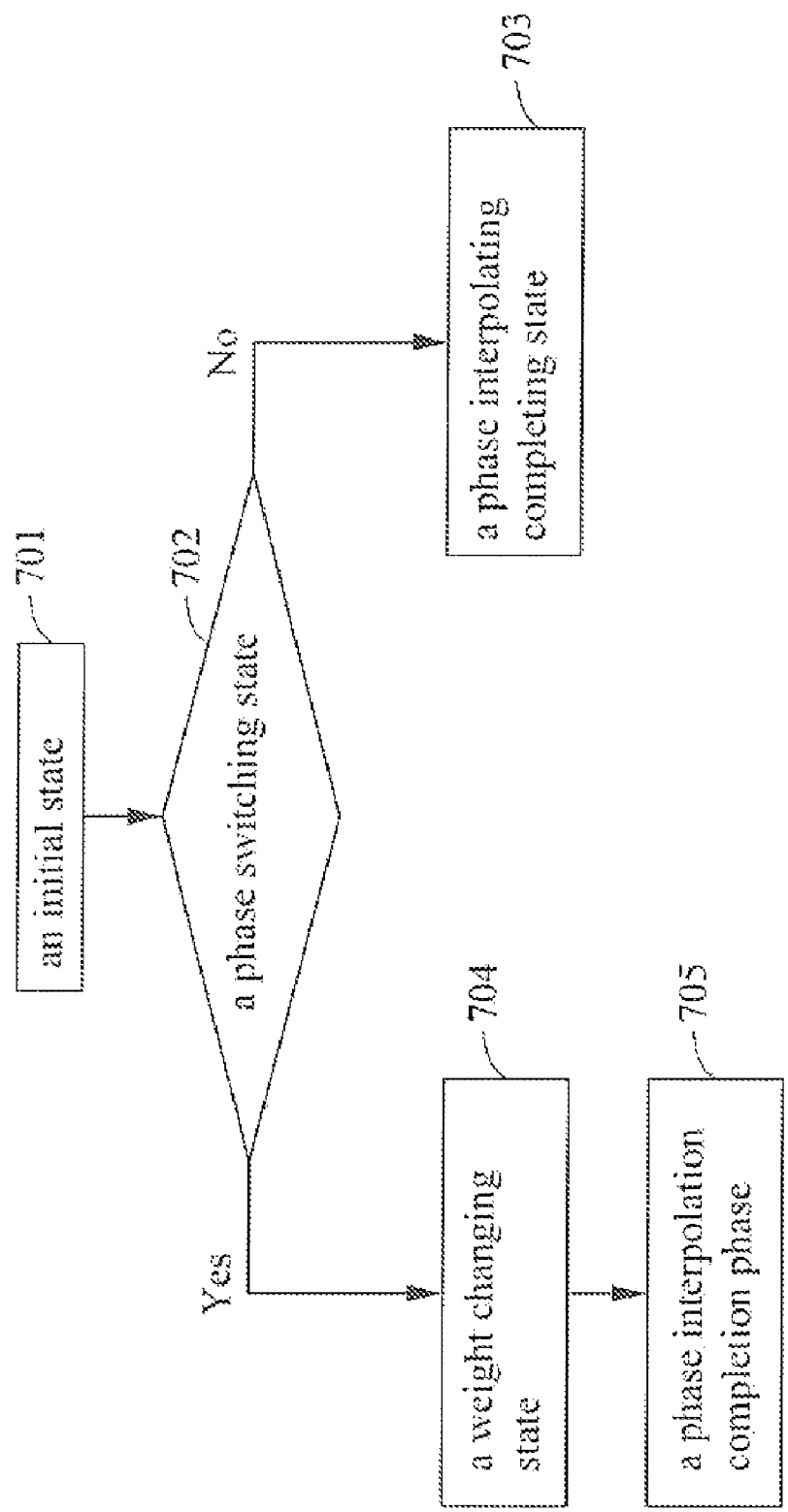
FIG. 7 relates to an illustration of states according to one of the preferred embodiments of the present invention.

FIG. 7 relates to the flow chart for FIG. 6 in the present invention, comprising: an initial state 701; a phase switching state 702, for judging whether or not the phase-interpolating circuit's input clock phase needs to be switched while switching the phase-interpolating circuit's output state (exemplarily, switching from clock 1 to clock 3); if no, undergoing a phase interpolating completing state 703 according to the desired output phase to adjust the interpolating ratio of the phase-interpolating ratio; if yes, undergoing a weight changing state 704 by assigning all of the phase-interpolating weight to unchanged input side (exemplarily clock 2); and a phase interpolation completion phase 705, according to the desired output phase to adjust the interpolating ratio of the phase-interpolating ratio.

Figure 8:
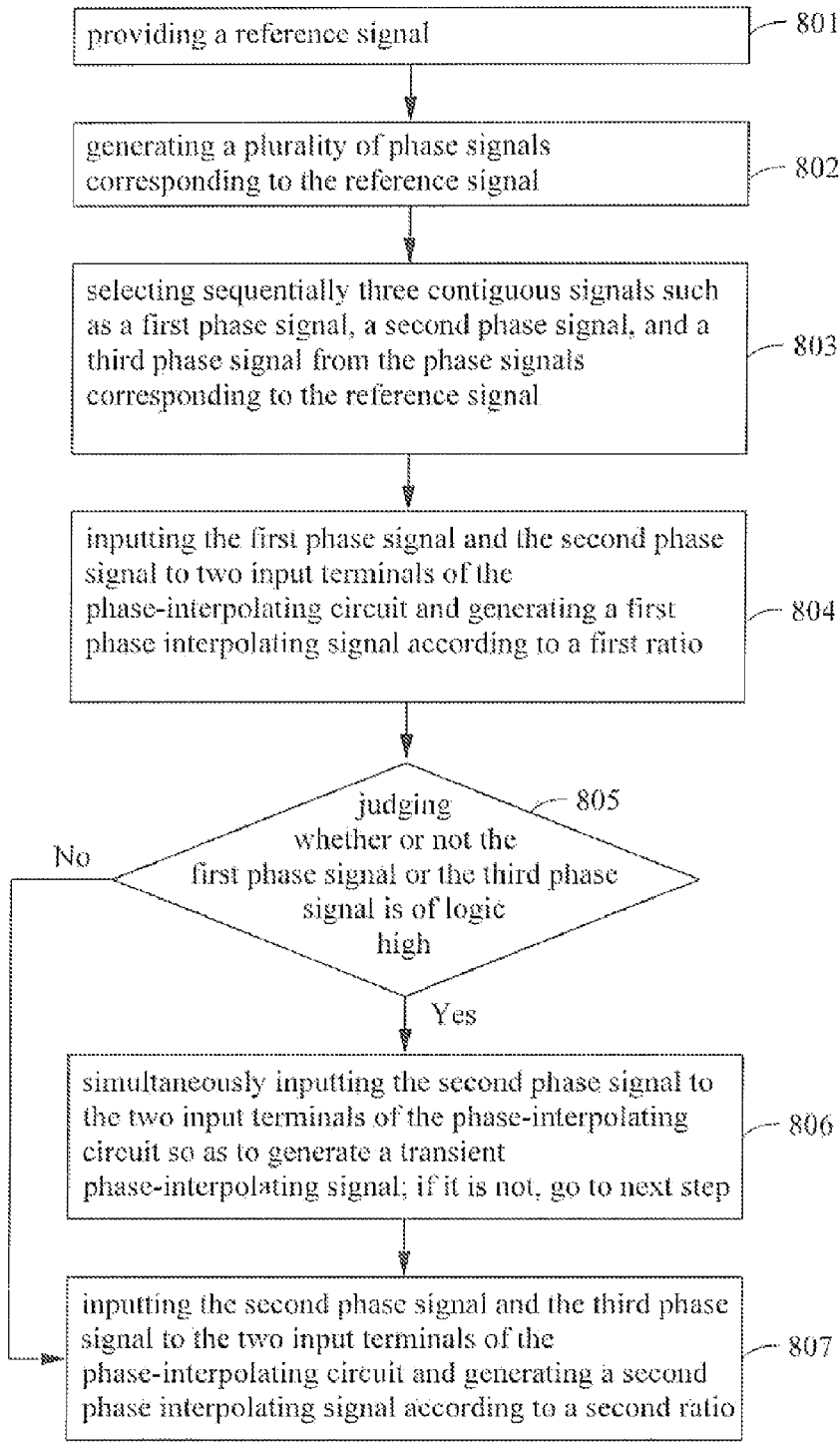
FIG. 8 relates to a flow chart according to one of the preferred embodiments of the present invention.

FIG. 8 relates to a method flow chart for the preferred embodiment of the present invention, comprising the steps of: s801: providing a reference signal; s802: generating a plurality of phase signals corresponding to the reference signal; s803: selecting sequentially three contiguous signals such as a first phase signal, a second phase signal, and a third phase signal from the phase signals corresponding to the reference signal; s804: inputting the first phase signal and the second phase signal to two input terminals of the phase-interpolating circuit and generating a first phase interpolating signal according to a first ratio; s805: judging whether or not the first phase signal or the third phase signal is of logic high; if it is, s806: simultaneously inputting the second phase signal to the two input terminals of the phase-interpolating circuit so as to generate a transient phase-interpolating signal; if it is not, go to next step; s807: inputting the second phase signal and the third phase signal to the two input terminals of the phase-interpolating circuit and generating a second phase interpolating signal according to a second ratio.

Figure 9:
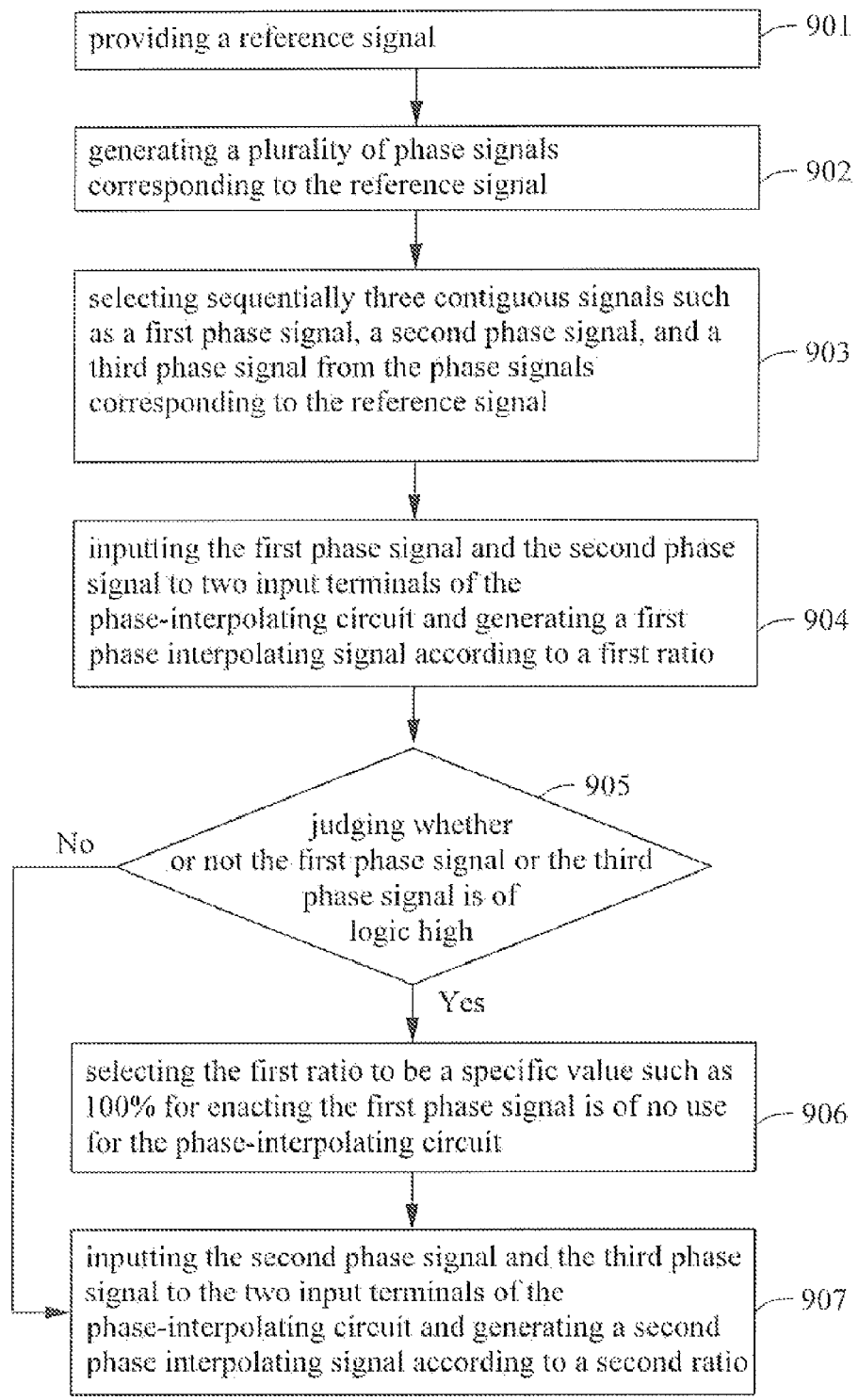
FIG. 9 relates to another flow chart according to one of the preferred embodiments of the present invention.

FIG. 9 relates to a method flow chart for the preferred embodiment of the present invention, comprising the steps of: s901: providing a reference signal; s902: generating a plurality of phase signals corresponding to the reference signal; s903: selecting sequentially three contiguous signals such as a first phase signal, a second phase signal, and a third phase signal from the phase signals corresponding to the reference signal; s904: inputting the first phase signal and the second phase signal to two input terminals of the phase-interpolating circuit and generating a first phase interpolating signal according to a first ratio; s905: judging whether or not the first phase signal or the third phase signal is of logic high; s906: if it is, selecting the first ratio to be a specific value such as 100% for enacting the first phase signal is of no use for the phase-interpolating circuit; if it is not, go to next step; s907: inputting the second phase signal and the third phase signal to the two input terminals of the phase-interpolating circuit and generating a second phase interpolating signal according to a second ratio.

Figure 10:
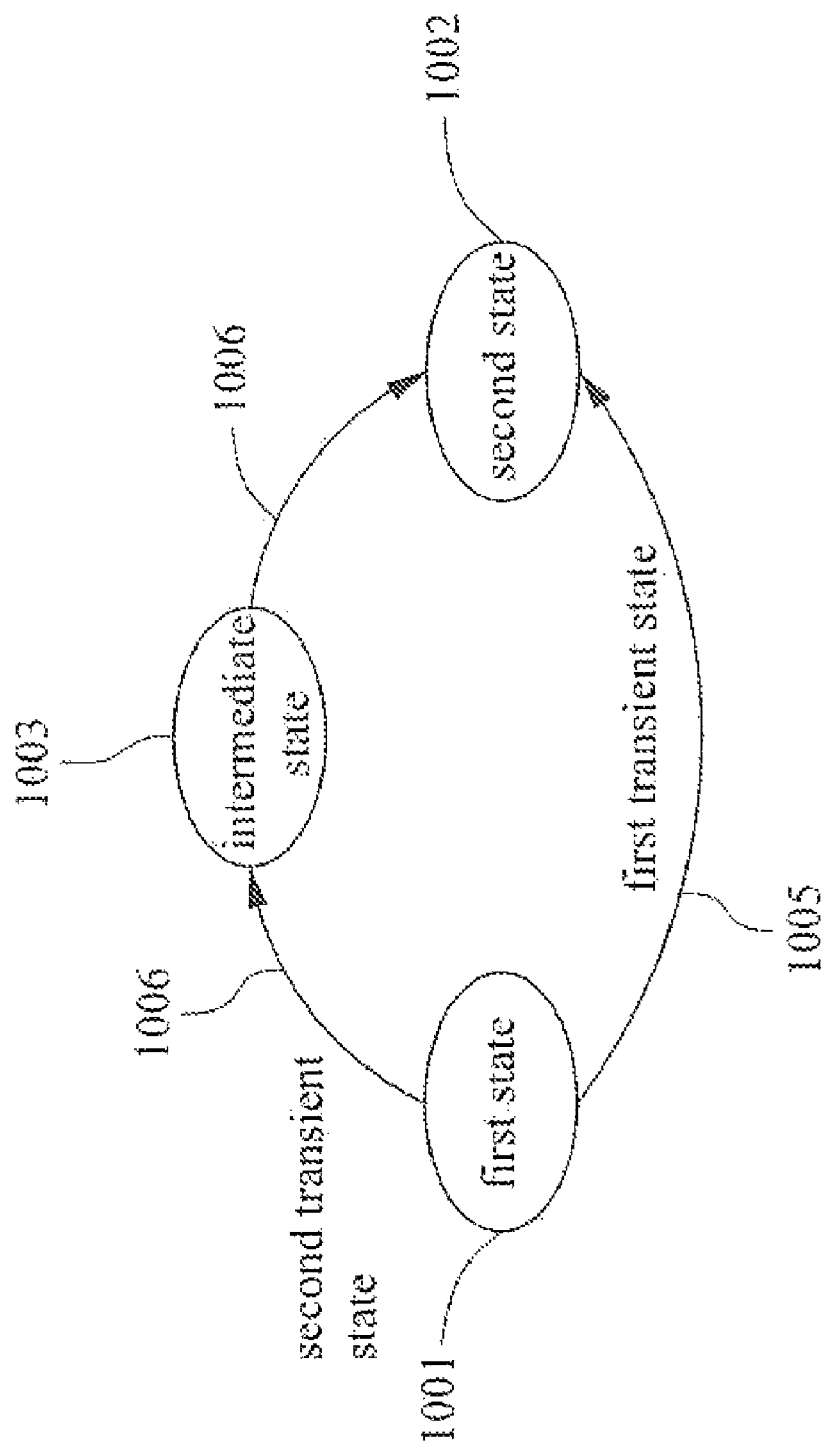
FIG. 10 relates to a preferred embodiment for the state machine according to the present invention.

FIG. 10 relates to a state machine of one of the preferred embodiments of the present invention, for preventing glitches occurred in a phase rotator and cooperating with the phase rotator to generate a digital clock signal based upon a reference clock, comprising: a first state 1001, for generating a first clock signal based upon a first weighted value of a first phase and a second phase; a second state 1002, for generating a second clock signal based upon a second weighted value of the second phase and a third phase; an intermediate state 1003, for generating an intermediate clock signal based upon the second phase; a first transient state 1004, for switching from the first state 1001 to the second state 1002 under a control signal; and a second transient state 1006, for switching from the first state 1001 to the second state 1002 via the intermediate state 1003 under the control signal; wherein, the first phase, the second phase, and the third phase are even-spaced phase in regard of the reference clock and the digital clock signal is selected from a group consisting of the first state 1001, the second state 1002, and the intermediate state 1003. Preferably, when the control signal is enabling, if the first phase or the third phase stays at logic high, then the digital clock signal stays at the second transient state 1006. In the contrary, if the first phase and the third phase stay at logic low, then the digital clock signal stays at the first transient state 1005. And at the second transient state 1006, the first weighted value is further amended fully according to the second phase.

Figure 11:
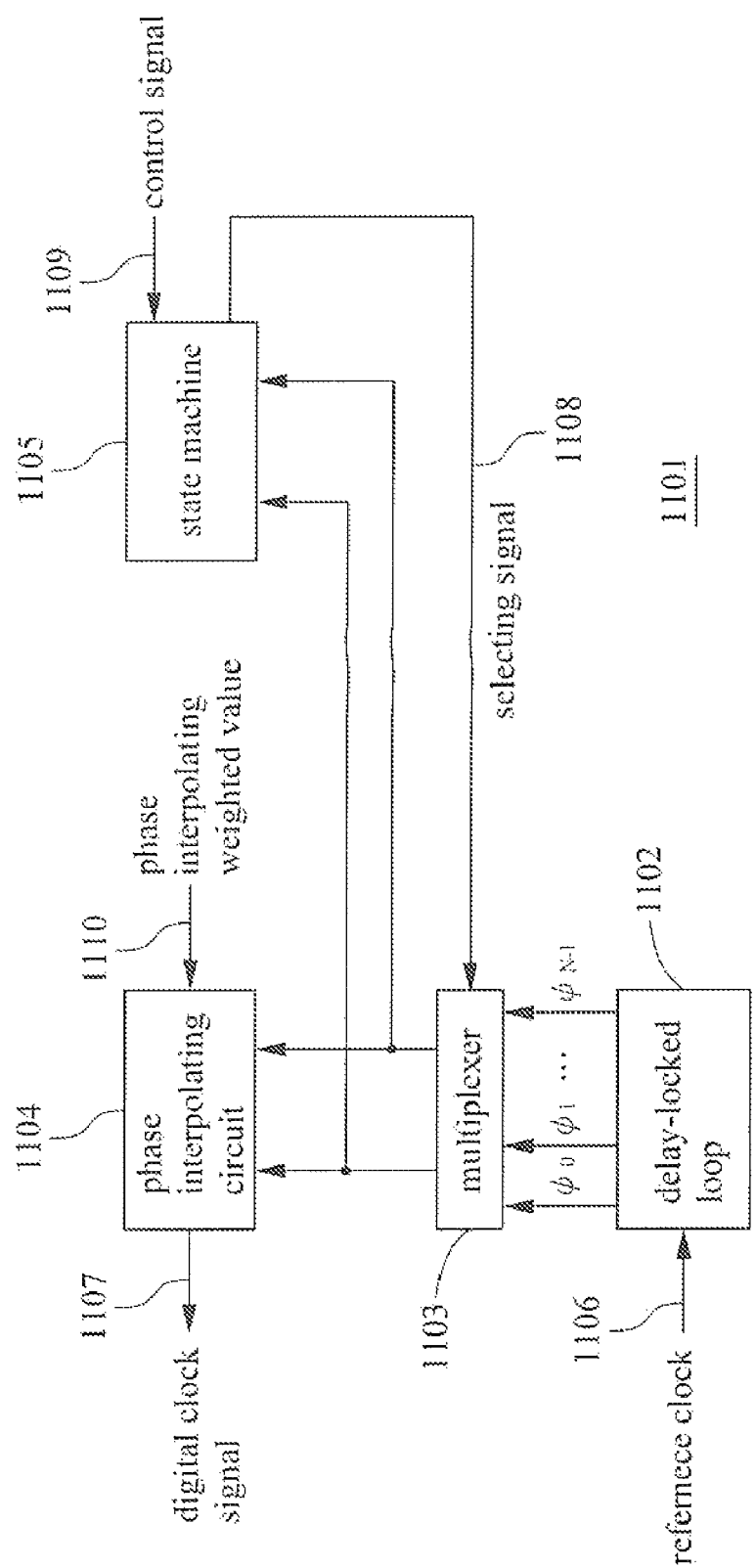
FIG. 11 relates to a preferred phase rotator according to the present invention.

FIG. 11 relates to a phase rotator 1101, as one of the preferred embodiments of the present invention, for receiving a reference clock 1106 so as to generate a digital clock signal 1107, comprises: a delay-locked loop 1102, for outputting a plurality of even-spaced phases $\psi_0$-$\psi_{N-1}$ according to the reference clock 1106; a multiplexer 1103, coupled to the delay-locked loop 1102, for selecting contiguous first phase and second phase selected from the even-spaced phases $\psi_0$-$\psi_{N-1}$ as its output according to a selecting signal 1108; a phase-interpolating circuit 1104, coupled to the multiplexer 1103, for outputting the digital clock signal 1107 by interpolating the two contiguous first phase and second phase based upon a phase interpolating weighted value 1110; and a state machine 1105, coupled to the multiplexer 1103 and the phase interpolating circuit 1104, for receiving a control signal 1109 and the two contiguous first and second phase so as to control the multiplexer 1103. Wherein, when the control signal 1109 is enabling and the first phase or a third phase which is contiguous to the second phase is of logic high, the state machine 1101 outputs the control signal 1109 so as to change the two contiguous first and second phase to be two second phases, and then the state machine 1101 outputs the selecting signal 1108 so as to change the two contiguous first phase and second phase to be the two contiguous second and third phase. When the control signal 1109 is enabling and the first phase and third phase are both of logic low, the state machine 1101 outputs the selecting signal 1108 so as to change the two contiguous first phase and second phase to be the two contiguous second and third phase.

Figure 12:
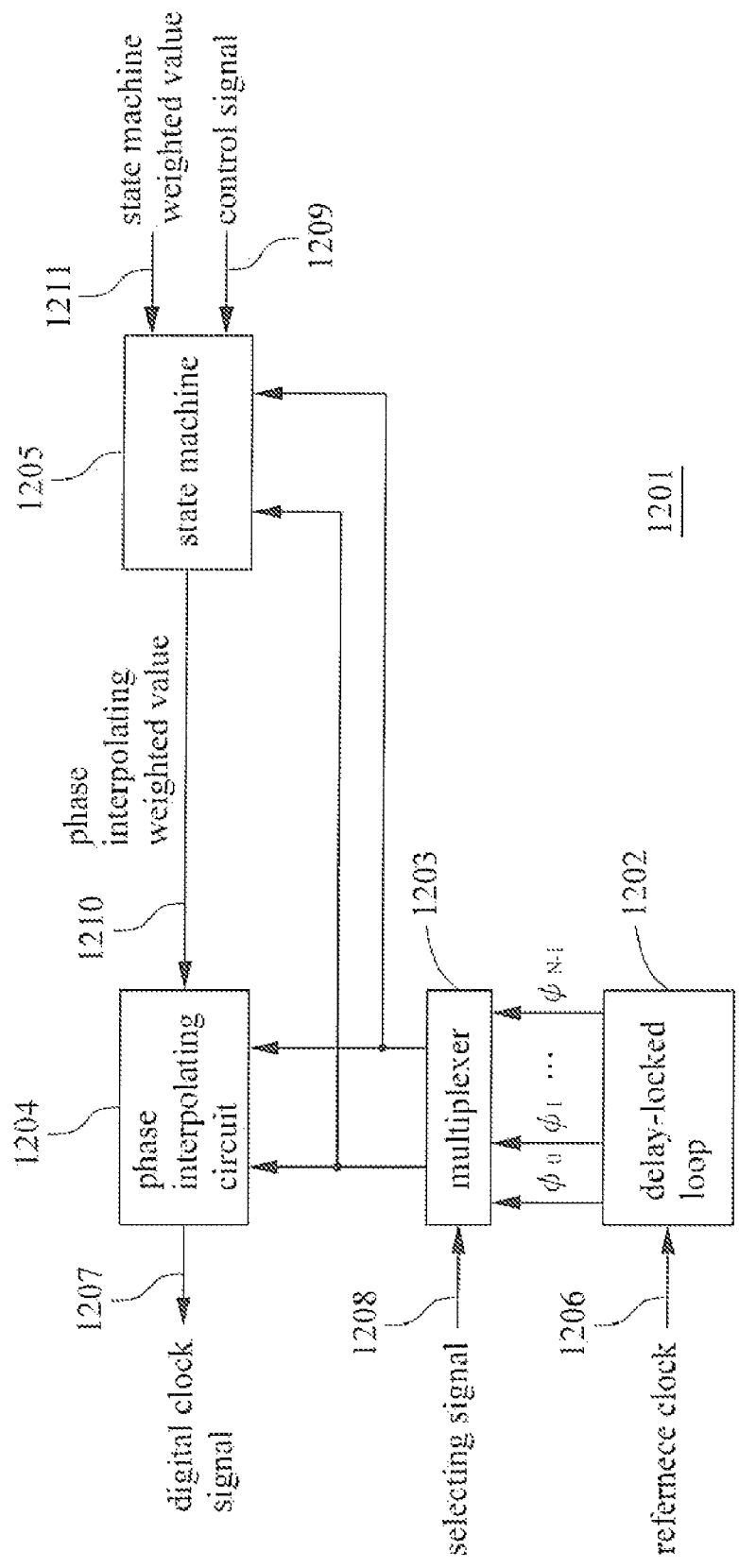
FIG. 12 relates to another preferred phase rotator according to the present invention.

FIG. 12 relates to a phase rotator 1201, as one of the preferred embodiments of the present invention, for receiving a reference clock 1206 so as to generate a digital clock signal 1207, comprises: a delay-locked loop 1202, for outputting a plurality of even-spaced phases $\psi_0$-$\psi_{N-1}$ according to the reference clock 1206; a multiplexer 1203, coupled to the delay-locked loop 1202, for selecting contiguous first phase and second phase selected from the even-spaced phases $\psi_0$~$\psi_{N-1}$ as its output according to a selecting signal 1208; a phase-interpolating circuit 1204, coupled to the multiplexer 1203, for outputting the digital clock signal 1207 by interpolating the two contiguous first phase and second phase based upon a phase interpolating weighted value 1210; and a state machine 1205, coupled to the multiplexer 1203 and the phase interpolating circuit 1204, for receiving a control signal 1209 and the two contiguous first and second phase and a state machine weighted value 1211 so as to control the 1210.

Wherein, when the control signal 1209 is enabling and the first phase or a third phase which is contiguous to the second phase is of logic high, the state machine 1205 firstly chooses the 1210 to be a specific value such as 100% so as to change the digital clock signal 1207 to be the second phase, and then use the state machine weighted value 1211 to act as the phase interpolating weighted value 1210. When the control signal 1209 is enabling and the first phase and third phase are both of logic low, the state machine weighted value 1211 equals to be the phase interpolating weighted value 1210.

Figure 13:
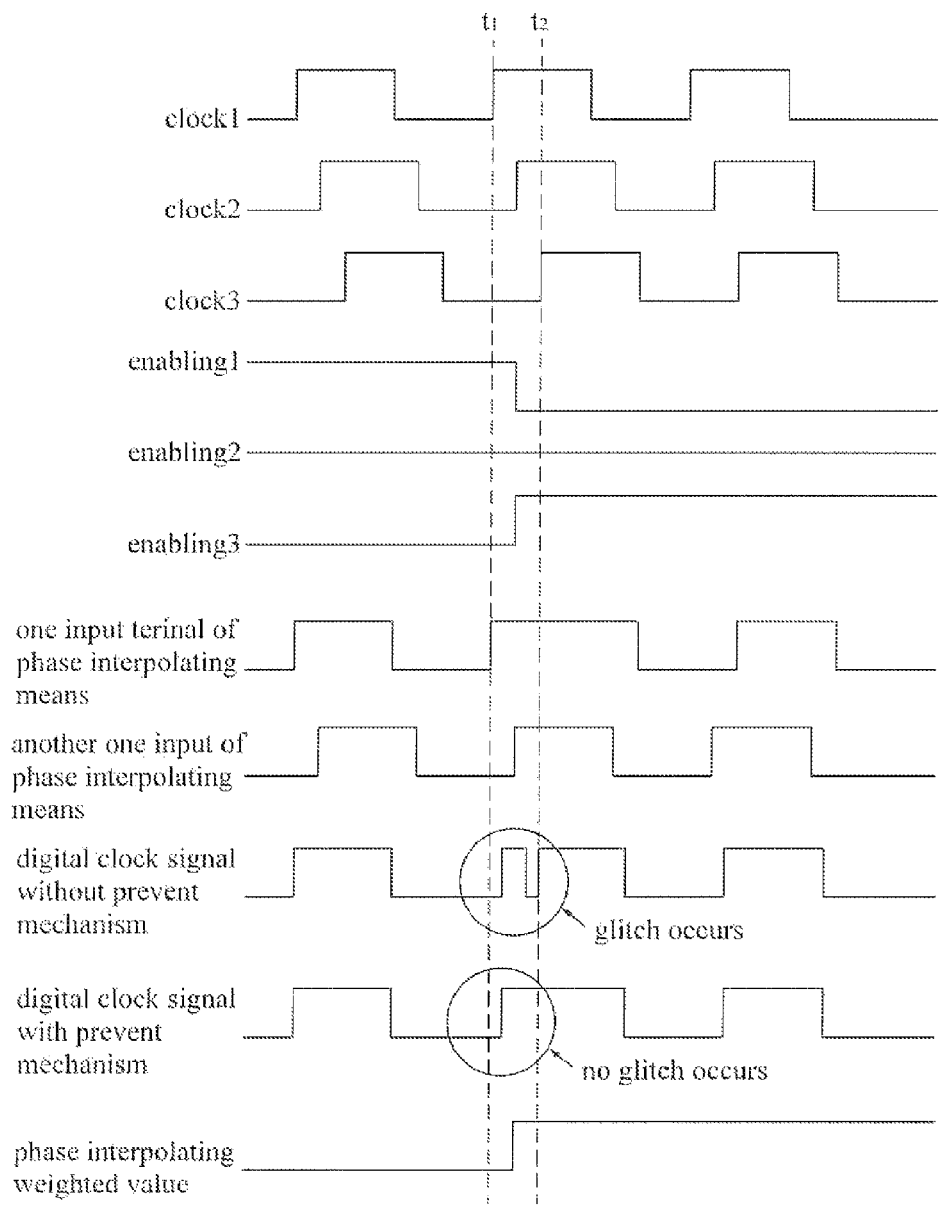
FIG. 13 relates to an plot showing the relationship between an enabling signal and output clock phases according to the present invention.

FIG. 13 further illustrates the relationship of enabling vs. output clock phases for the phase rotator 1101. Before $t_1$ and after $t_2$, all signals are identical in term of their waveforms, thus duplicate information will be omitted. Between $t_1$ and $t_2$, one input terminal of the phase interpolating circuit 1104 has the same waveform as clock 2 does, meanwhile, at the rising/falling edges for enabling 1 and enabling 3, another input terminal of the phase interpolating circuit 1104 is switched firstly from clock 1 to clock 2, and then to clock 3 at $t_2$. Consequently, regardless any changes of the weighted values at the rising/falling edges for enabling 1 and enabling 3, no glitch will occur.

Figure 14:
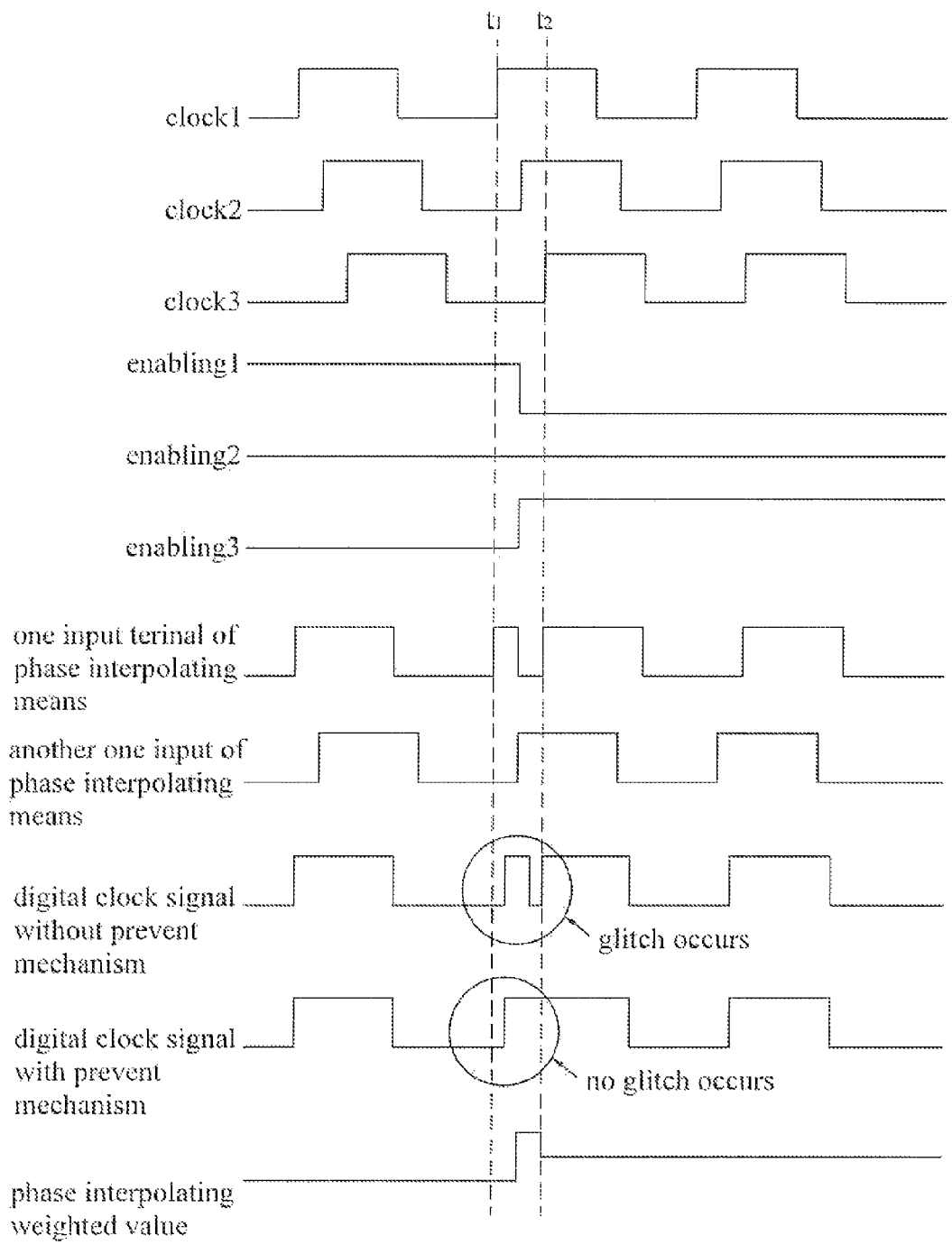
FIG. 14 relates to another plot showing the relationship between an enabling signal and output clock phases according to the present invention.

FIG. 14 further illustrates the relationship of enabling vs. output clock phases for the phase rotator 1201. Before $t_1$ and after $t_2$, all signals are identical in term of their waveforms, thus duplicate information will be omitted. Between $t_1$ and $t_2$, one input terminal of the phase interpolating circuit 1104 has the same waveform as clock 2 does, meanwhile, at the rising/falling edges for enabling 1 and enabling 3, the weighted value of the phase interpolating circuit 1104 firstly switched to 1 so as to enact the clock 1 or clock 3 is of no use to the 1104, and then a desired weighted value after t2 is chosen. Consequently, regardless any changes of the weighted values at the rising/falling edges for enabling 1 and enabling 3, no glitch will occur.

The invention being thus aforesaid, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A phase rotator, for receiving a reference clock so as to generate a digital clock signal, comprising:
a delay-locked loop, for outputting a plurality of even-spaced phases according to the reference clock;
a multiplexer, coupled to the delay-locked loop, for selecting two contiguous first phase and second phase selected from the even-spaced phases as its output according to a selecting signal;
a phase-interpolating circuit, coupled to the multiplexer, for outputting the digital clock signal by interpolating the two contiguous first phase and second phase based upon a phase interpolating weighted value; and
a state machine, coupled to the multiplexer and the phase interpolating circuit, for receiving a control signal and the two contiguous first and second phase, and controlling the multiplexer;
wherein, when the control signal is enabling and the first phase or a third phase which is contiguous to the second phase is of logic high, the state machine outputs the control signal so as to change the two contiguous first and second phase to be two second phases, and then the state machine outputs the selecting signal so as to change the two contiguous first phase and second phase to be the two contiguous second and third phase.

2. The state machine as recited in claim 1, wherein, when the control signal is enabling and the first phase and a third phase which is contiguous to the second phase are both of logic low, the state machine outputs the selecting signal so as to change the two contiguous first phase and second phase to be the two contiguous second and third phase.

3. A phase rotator, for receiving a reference clock so as to generate a digital clock signal, comprising:
- a delay-locked loop, for outputting a plurality of even-spaced phases according to the reference clock;
- a multiplexer, coupled to the delay-locked loop, for selecting two contiguous first phase and second phase selected from the even-spaced phases as its output according to a selecting signal;
- a phase-interpolating circuit, coupled to the multiplexer, for outputting the digital clock signal by interpolating the two contiguous first phase and second phase based upon a phase interpolating weighted value; and
- a state machine, coupled to the multiplexer and the phase interpolating circuit, for receiving a control signal, the two contiguous first and second phase, and a state machine weighted value, and controlling the multiplexer;
- wherein, when the control signal is enabling and the first phase or a third phase which is contiguous to the second phase is of logic high, the state machine firstly chooses the phase interpolating weighted value to be a specific value so as to change the digital clock signal to be the second phase, and then use the state machine weighted value to act as the phase interpolating weighted value.

4. The phase rotator as recited in claim 3, wherein the specific value is 100%.

5. The phase rotator as recited in claim 3, wherein, when the control signal is enabling and the first phase and a third phase which is contiguous to the second phase are both of logic low, the state machine weighted value equals to be the phase interpolating weighted value.

6. A method for preventing glitches caused by clock switching in a phase-interpolating circuit, comprising:
a) providing a reference signal;
b) generating a plurality of phase signals corresponding to the reference signal;
c) selecting sequentially three contiguous signals, a first phase signal, a second phase signal, and a third phase signal from the phase signals corresponding to the reference signal;
d) inputting the first phase signal and the second phase signal to the phase-interpolating circuit and generating a first phase interpolating signal according to a first ratio;
e) judging whether or not the first phase signal or the third phase signal is of logic high; if it is, inputting the second phase signal to the phase-interpolating circuit so as to generate a transient phase-interpolating signal; if it is not, go to next step; and
f) inputting the second phase signal and the third phase signal to the phase-interpolating circuit and generating a second phase interpolating signal according to a second ratio.

7. The method as recited in claim 6, wherein, the plurality of phase signals corresponding to the reference signal are even-spaced phase signals with regard to the reference signal.

8. The method as recited in claim 6, wherein, the first ratio and the second ratio are determined by ratio between two bias currents of the phase-interpolating circuit.

9. A method for preventing glitches caused by clock switching in a phase-interpolating circuit, comprising:
a) providing a reference signal;
b) generating a plurality of phase signals corresponding to the reference signal;
c) selecting sequentially three contiguous signals, a first phase signal, a second phase signal, and a third phase signal from the phase signals corresponding to the reference signal;
d) inputting the first phase signal and the second phase signal to the phase-interpolating circuit and generating a first phase interpolating signal according to a first ratio;
e) judging whether or not the first phase signal or the third phase signal is of logic high; if it is, selecting the first ratio to be a specific value for enacting the first phase signal is of no use for the phase-interpolating circuit; if it is not, go to next step; and
f) inputting the second phase signal and the third phase signal to the phase-interpolating circuit and generating a second phase interpolating signal according to a second ratio.

10. The method as recited in claim 9, wherein, the plurality of phase signals corresponding to the reference signal are even-spaced phase signals with regard to the reference signal.

11. The method as recited in claim 9, wherein, the first ratio and the second ratio are determined by ratio between two bias currents of the phase-interpolating circuit.

12. The method as recited in claim 9, wherein, the specific value is 100%.

13. A phase rotator, for receiving a reference clock so as to generate a digital clock signal, comprising:
- a delay-locked loop, for outputting a plurality of even-spaced phases according to the reference clock;
- a multiplexer, coupled to the delay-locked loop, for selecting two contiguous first phase and second phase selected from the even-spaced phases as its output according to a selecting signal;
- a phase-interpolating circuit, coupled to the multiplexer, for outputting the digital clock signal by interpolating the two contiguous first phase and second phase based upon a phase interpolating weighted value; and
- a state machine, coupled to the multiplexer and the phase interpolating circuit, for receiving a control signal and the two contiguous first and second phase, and controlling the multiplexer;
- wherein, when the control signal is enabling and the first phase and a third phase which is contiguous to the second phase are both of logic low, the state machine outputs the selecting signal so as to change the two contiguous first phase and second phase to be the two contiguous second and third phase.

14. A phase rotator, for receiving a reference clock so as to generate a digital clock signal, comprising:
- a delay-locked loop, for outputting a plurality of even-spaced phases according to the reference clock;
- a multiplexer, coupled to the delay-locked loop, for selecting two contiguous first phase and second phase selected from the even-spaced phases as its output according to a selecting signal;
- a phase-interpolating circuit, coupled to the multiplexer, for outputting the digital clock signal by interpolating the two contiguous first phase and second phase based upon a phase interpolating weighted value; and
- a state machine, coupled to the multiplexer and the phase interpolating circuit, for receiving a control signal, the two contiguous first and second phase, and a state machine weighted value, and controlling the multiplexer ;
- wherein, when the control signal is enabling and the first phase and a third phase which is contiguous to the second phase are both of logic low, the state machine weighted value equals to be the phase interpolating weighted value.

* * * * *